(12) United States Patent
Hetzel

(10) Patent No.: US 7,174,529 B1
(45) Date of Patent: Feb. 6, 2007

(54) ACUTE ANGLE AVOIDANCE DURING ROUTING

(75) Inventor: Asmus G. Hetzel, Berlin (DE)

(73) Assignee: Cadence Design Systems, Inc., San Jose, CA (US)

(*) Notice: Subject to any disclaimer, the term of this patent is extended or adjusted under 35 U.S.C. 154(b) by 351 days.

(21) Appl. No.: 10/779,954

(22) Filed: Feb. 14, 2004

(51) Int. Cl.
*G06F 17/50* (2006.01)

(52) U.S. Cl. ................ 716/13; 716/4; 716/5; 716/9; 716/10; 716/12

(58) Field of Classification Search ............ 716/4, 716/5, 9, 10, 13, 15, 21
See application file for complete search history.

(56) References Cited

U.S. PATENT DOCUMENTS

| | | | |
|---|---|---|---|
| 5,822,214 A * | 10/1998 | Rostoker et al. | 716/10 |
| 6,256,769 B1 * | 7/2001 | Tamarkin et al. | 716/12 |
| 6,802,048 B2 * | 10/2004 | Goto et al. | 716/5 |
| 6,938,230 B2 * | 8/2005 | Frank et al. | 716/4 |
| 6,996,793 B1 * | 2/2006 | Kronmiller et al. | 716/9 |
| 2003/0126582 A1 * | 7/2003 | Kobayashi et al. | 716/21 |
| 2003/0192019 A1 * | 10/2003 | Goto et al. | 716/5 |
| 2004/0225990 A1 * | 11/2004 | Jacques et al. | 716/13 |
| 2005/0172247 A1 * | 8/2005 | Papadopoulou et al. | 716/5 |
| 2005/0223348 A1 * | 10/2005 | Frank et al. | 716/5 |
| 2005/0273744 A1 * | 12/2005 | Allen et al. | 716/10 |

OTHER PUBLICATIONS

NB8911253, "Polygonal Expansion Algorithm", Nov. 1, 1989, vol. No. 32, Issue No. 6B, p. No. 253-264 ☐☐.*

* cited by examiner

*Primary Examiner*—Jack Chiang
*Assistant Examiner*—Helen Rossoshek
(74) *Attorney, Agent, or Firm*—Stattler, Johansen & Adeli LLP

(57) ABSTRACT

Determining a route between a start to the target geometry by producing potential route segments and testing the segments to determine whether they create acute angles in the route. If a potential route segment produces an acute angle in the route, it is prevented from being included in the route. Some embodiments define at least one border region about each start or target geometry. Associated with each border region are one or more routing rules that specify valid routing configuration that do not produce acute angles in the route within the border region. To avoid acute angles in the routing pathway between the start and target geometries, some embodiments test for acute angles at connection points between route segments using pretabulated tables that define connection configurations between route segments that do not contain acute angles.

31 Claims, 11 Drawing Sheets

| |
|---|
| 5th Layer: -45 Diagonal |
| 4th Layer: +45 Diagonal |
| 3rd Layer: Horizontal |
| 2nd Layer: Vertical |
| 1st Layer: Horizontal |
*Figure 1*
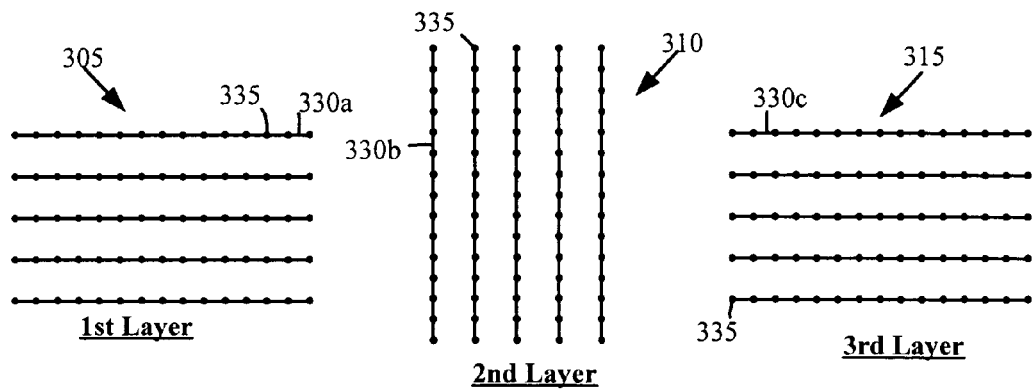
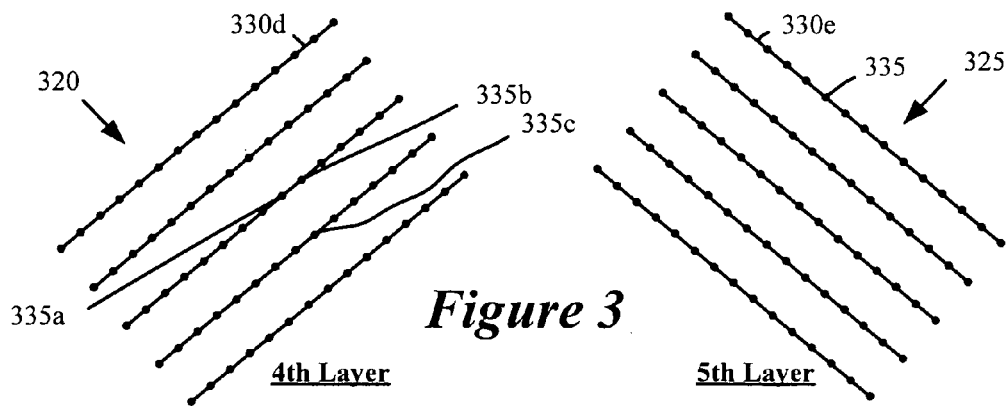
*Figure 3*

ACUTE ANGLE AVOIDANCE DURING ROUTING

FIELD OF THE INVENTION

The present invention is directed towards method and apparatus for acute angle avoidance during routing.

BACKGROUND OF THE INVENTION

An integrated circuit ("IC") is a device (e.g., a semiconductor device) that includes many electronic components, such as transistors, resistors, diodes, etc. These components are often interconnected to form multiple circuit components, such as gates, cells, memory units, arithmetic units, controllers, decoders, etc. An IC includes multiple layers of wiring that interconnect its electronic and circuit components. Traditionally, IC's use preferred direction ("PD") wiring models, which specify a preferred wiring direction for each of their wiring layers. In preferred direction wiring models, the preferred direction typically alternates between successive wiring layers.

One example of a PD wiring model is the PD Manhattan wiring model, which specifies alternating layers of preferred-direction horizontal and vertical wiring. Another example of a PD wiring model is the PD diagonal wiring model, which specifies alternating layers of preferred-direction diagonal wiring. The PD diagonal wiring model can allow for shorter wiring distances than the PD Manhattan wiring model and can decrease the total wirelength needed to interconnect the electronic and circuit components of an IC.

Design engineers design IC's by transforming logical or circuit descriptions of the IC's components into geometric descriptions, called layouts. IC layouts typically include (1) circuit modules (i.e., geometric representations of electronic or circuit IC components) with pins, and (2) interconnect lines (i.e., geometric representations of wiring) that connect the pins of the circuit modules. A net is typically defined as a collection of pins that need to be connected. To create layouts, design engineers typically use electronic design automation ("EDA") applications. These applications provide sets of computer-based tools for creating, editing, and analyzing IC design layouts. One EDA tool is a wire router that defines routes for interconnect lines that connect the pins of nets. A wire router that explores Manhattan and diagonal routing directions on the same layer of an IC, however, typically produces routes containing acute angles. Routes containing acute angles have undesirable physical and electrical characteristics.

After routing has been performed, a DRC (design rule check) is performed to determine any design rule violations in the layout. A layout design often has to comport with a variety of design rules, such as having routes with no acute angles or having route segments that meet a minimum length requirement. A DRC violation occurs when a design violates such a design rule. If any acute angles are detected by the DRC process, another process is performed to correct the routes having the acute angles. For example, portions of routes having acute angles may be "filled-in" to create non-acute angles. Post-routing correction processes, however, may produce other DRC violations in the layout.

As such, there is a need for a router and routing method that tests for acute angles during the routing process to help avoid creating routes with acute angles. If acute angles are avoided in the routing process, there would be fewer or no corrections needed to eliminate acute angles after the routing process.

SUMMARY OF THE INVENTION

Some embodiments of the invention provide a router that routes a connection pathway between a start and target geometry while testing for acute angles in the route. In some embodiments, the router defines routes in a region of a multi-layer integrated circuit ("IC") layout. The method performs a path search to determine a routing pathway (route) that connects the start and target geometries. In performing the path search, one or more potential route segments that may be included in the route are produced. During performance of the path search, the potential route segments are tested to determine whether they create acute angles in the route. If a potential route segment is determined to produce an acute angle in the route, the potential route segment is prevented from being included in the route.

To avoid acute angles at connection points to the start and target geometries, some embodiments define at least one border region about each start or target geometry. Associated with each border region of a start or target geometry are one or more routing rules that specify valid routing configurations that do not produce acute angles in the route within the border region. For example, a routing rule may prohibit particular routing directions within the border region that would result in an acute angle being formed at the connection point between a route segment in the route and a start or target geometry.

To avoid acute angles in the routing pathway between the start and target geometries (i.e., in the routing pathway outside of the border regions of the start and target geometries), some embodiments test for acute angles at connection points between route segments. In these embodiments, pretabulated tables are created to define connection configurations between route segments that do no contain acute angles.

BRIEF DESCRIPTION OF THE DRAWINGS

The novel features of the invention are set forth in the appended claims. However, for purpose of explanation, several embodiments of the invention are set forth in the following figures.

FIG. 1 illustrates a five-layer wiring model.

FIG. 3 illustrates five routing grids for the five-layer wiring model of FIG. 1.

DETAILED DESCRIPTION OF THE INVENTION

Figure 2A:
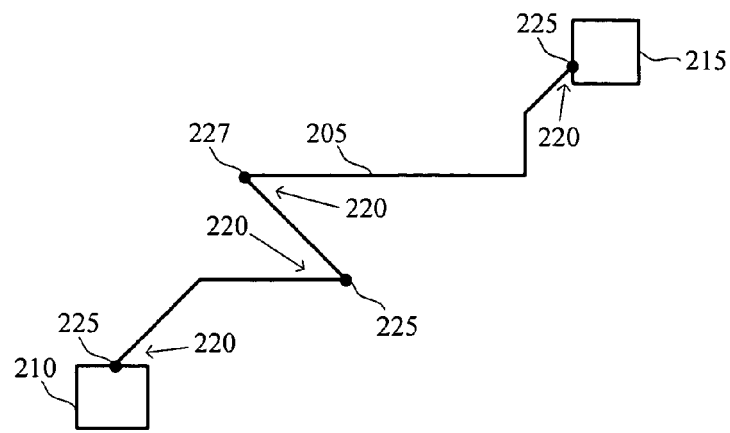
FIGS. 2A and 2B are top views of examples of detailed routes between various start and target geometries.

In the following description, numerous details are set forth for purpose of explanation. However, one of ordinary skill in the art will realize that the invention may be practiced without the use of these specific details. In other instances, well-known structures and devices are shown in block diagram form in order not to obscure the description of the invention with unnecessary detail.

Some embodiments of the invention provide a router that routes a connection pathway between a start and target geometry while testing for acute angles in the route. In some embodiments, the router defines routes in a region of a multi-layer integrated circuit ("IC") layout. The method performs a path search to determine a routing pathway (route) that connects the start and target geometries. In performing the path search, one or more potential route segments that may be included in the route are produced. During performance of the path search, the potential route segments are tested to determine whether they create acute angles in the route. If a potential route segment is determined to produce an acute angle in the route, the potential route segment is prevented from being included in the route.

To avoid acute angles at connection points to the start and target geometries, some embodiments define at least one border region about each start or target geometry. Associated with each border region of a start or target geometry are one or more routing rules that specify valid routing configurations that do not produce acute angles in the route within the border region. For example, a routing rule may prohibit particular routing directions within the border region that would result in an acute angle being formed at the connection point between a route segment in the route and a start or target geometry.

To avoid acute angles in the routing pathway between the start and target geometries (i.e., in the routing pathway outside of the border regions of the start and target geometries), some embodiments test for acute angles at connection points between route segments. In these embodiments, pretabulated tables are created to define connection configurations between route segments that do no contain acute angles.

Before describing the two approaches mentioned above, several terms and concepts are defined below in Section I. Section II then describes a general method of acute angle avoidance during routing. Section III describes acute angle avoidance where a route segment connects to a start or target geometry. And Section IV describes acute angle avoidance along the routing pathway from a start geometry to a target geometry.

I. Terms and Concepts

A detailed router defines detailed routes for an IC layout. Routable elements in the IC-layout include, for example, pins, previously defined interconnect lines, via pads, etc. In some embodiments, the router uses a five-layer wiring model that is illustrated in FIG. 1. As shown in this figure, this wiring model has horizontal wiring on wiring layer 1, vertical wiring on wiring layer 2, horizontal wiring on wiring layer 3, +45° diagonal wiring on wiring layer 4, and −45° diagonal wiring on wiring layer 5. One of ordinary skill will realize that the router can use other wiring models in other embodiments.

In some embodiments, an interconnect line is "horizontal" or "vertical" in orientation if it forms an angle of 0° or 90° with respect to one of the coordinate axes of the layout. On the other hand, a line is "diagonal" in orientation if it forms an angle other than 0° or 90° with respect to the layout's Cartesian coordinate axes, which are typically parallel with the layout's boundary and/or the boundary of the layout's expected IC. For instance, in some embodiments, a 45° diagonal line is one that is at a 45° orientation (in the counterclockwise direction) with respect to the x-axis, while a −45° diagonal line is one that is at a −45° orientation (in the counterclockwise direction) with respect to the x-axis. In the embodiments below, the horizontal, vertical, and ±45° routing directions are available on each wiring layer (although each layer has one preferred routing direction). The four routing directions on each layer provide eight possible directions (called segment directions) for a route to traverse from any point on a layer. These segment directions are 0°, 45°, 90°, 135°, 180°, 225°, 270°, and 315°.

Figure 2B:
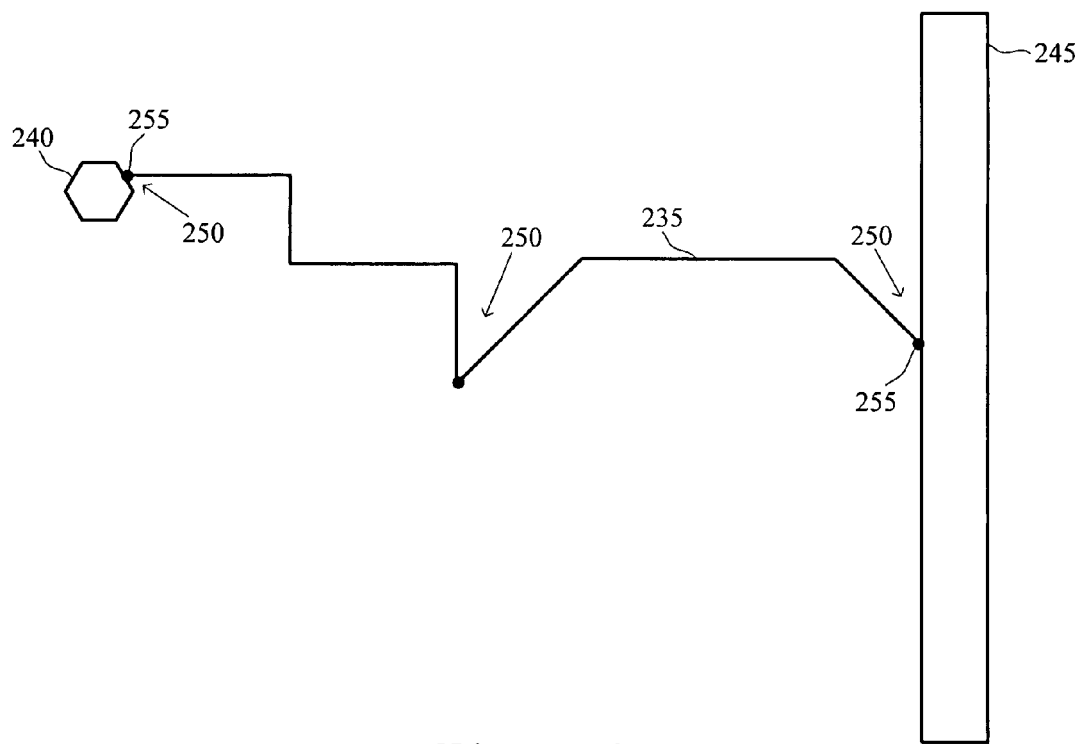

FIGS. 2A and 2B are top views of examples of detailed routes between various start and target geometries. The detailed routes shown in FIGS. 2A and 2B are comprised of route segments having horizontal, vertical, +45°, or −45° orientations. As such, acute angles can form at connection points between the route segments of the detailed routes. The start or target geometries shown in FIGS. 2A and 2B may be pins, previously defined interconnect lines, via pads, etc. Each start or target geometry is defined by three or more sides. Similar to a route segment, a side of a geometry may have a horizontal, vertical, +45°, or −45° orientation. As such, acute angles can form at connection points between route segments of the detailed routes and a side of a start or target geometry.

FIG. 2A shows a top view of a detailed route 205 that connects a first pin (that is a start geometry 210) and a second pin (that is a target geometry 215). As shown in FIG. 2A, acute angles 220 can be formed at a connection point 225 between a side of a start or target geometry and a route segment of the detailed route 205. Acute angles 220 can be also be formed at connection points 227 between two route segments of the of the detailed route 205.

FIG. 2B shows a top view of a detailed route 235 between a via pad (that is a start geometry 240) and a interconnect line (that is a target geometry 245). As shown in FIG. 2B, acute angles 250 can be formed at a connection point 255 between a side of a start or target geometry and a route segment of the detailed route 235. An acute angles 250 can also be formed at connection points 260 between two route segments of the detailed route 235.

To define detailed routes for an IC layout, the embodiments described below first define a routing graph that includes a routing grid for each routing layer. As illustrated in FIG. 1, each routing layer has a preferred routing direction in some embodiments. In some of these embodiments, each routing grid of each particular routing layer includes numerous routing tracks that are in the preferred routing direction of the particular routing layer. For instance, FIG. 3 illustrates five routing grids 305–325 for the five-layer wiring model of FIG. 1. Each of these routing grids includes numerous tracks 330 that are in the preferred routing direction of their layer. For example, the routing grid 320 for the fourth layer has numerous tracks 330*d* that are in the +45° preferred routing direction of the fourth layer in the five-layer model of FIG. 1.

Each track is formed by numerous edges that connect numerous grid points 335 along the track. The router is said to be a "gridded" router when the grid points in the routing graph (i.e., the grid points in all the routing grids) do not include all the grid points of the manufacturing grid, which is the grid used by the IC manufacturing process. On the other hand, the router is said to be "gridless" when its routable states (e.g., its grid points, nodes, lines, surfaces, etc.) are not aligned with any arbitrary routing grid. The routable states of a gridless router are typically aligned with the grid of the manufacturing process (i.e., typically each point on the manufacturing grid is a routable state in one of the routing grids), so that the final layout can be easily manufactured. However, in certain instances, the gridless routers might not even be aligned with the manufacturing grid. In some cases, the gridless routers are aligned with a grid that is even finer (i.e., has a higher resolution) than the manufacturing grid.

The grid points along the tracks serve as the start, intermediate, termination, and bend points of routes. After a router selects a start and target geometry for routing, a path search is performed to identify a route between the start and target geometries. The path search identifies a path from a start geometry to a target geometry by iteratively identifying path expansions along the grid, where each expansion is from a start grid point to a destination grid point that define a potential route segment. On a particular layer, a route segment can go from a first grid point on a first track to a second adjacent grid point on a second track (i.e., a route can have a segment that traverses the particular layer in a direction that is not the preferred direction of the particular layer).

Figure 4:
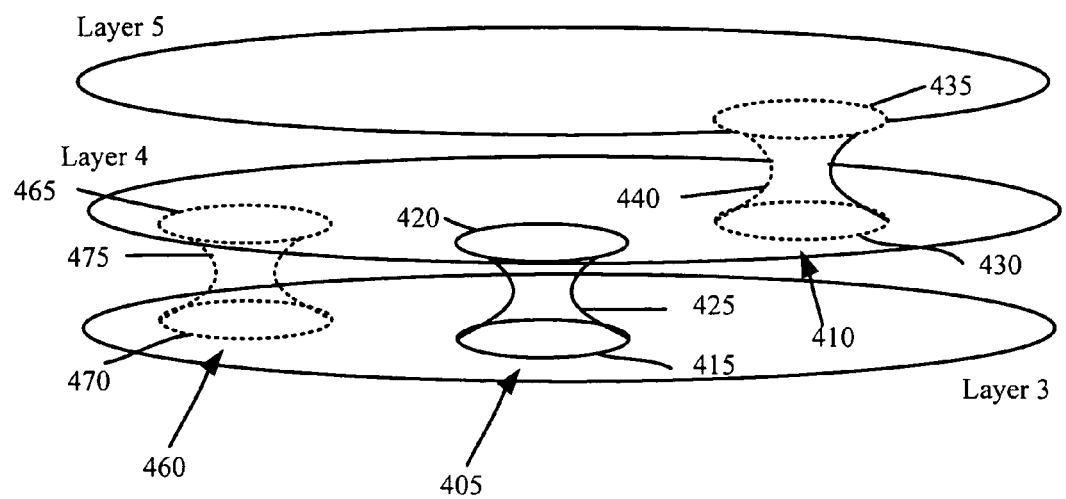
FIG. 4 illustrates three vias.

In the embodiments described below, a route can traverse multiple layers. Such a route is a multi-layer route. A multi-layer route uses at least one non-planar route segment (i.e., via) to traverse from one layer to another. In some embodiments, a via includes (1) one pad on each of the two layers that it traverses and (2) a cut that is the three-dimensional hole between the two layers. FIG. 4 illustrates three vias, a first via 405 that is between wiring layers 3 and 4, a second via 410 that is between wiring layers 4 and 5, and a third via 460 that is between wiring layers 3 and 4. Via 405 has pad 415 on layer 3, pad 420 on layer 4, and cut 425 between layers 3 and 4. Via 410 has pad 430 on layer 4, pad 435 on layer 5, and cut 440 between layers 4 and 5. Via 460 has pad 470 on layer 3, pad 465 on layer 4, and cut 475 between layers 3 and 4.

Figure 5:
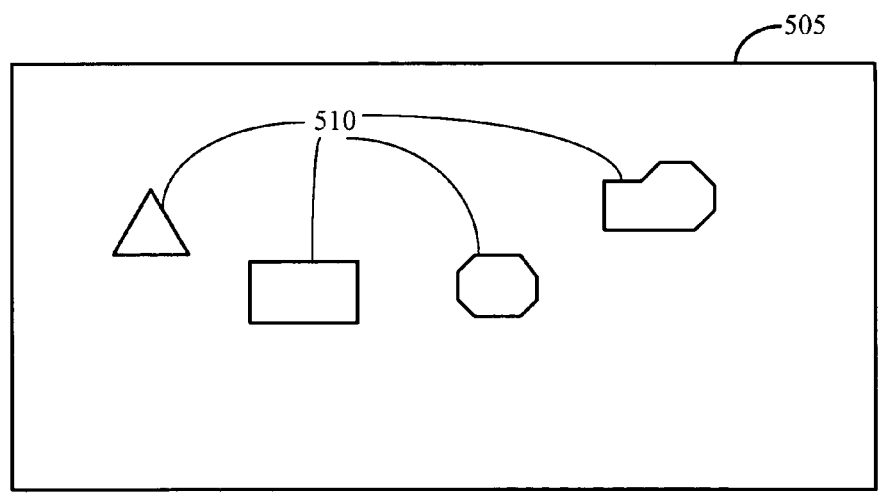
FIG. 5 illustrates a top view of vias with different via pad shapes.

A via pad has a particular geometric shape when viewed from above. Typically, for each pair of adjacent layers, there is one via pad shape available for use on the pair of adjacent layers. In other embodiments, however, there is more than one via pad shape available for use for each pair of adjacent layers. FIG. 5 illustrates a top view of a region 505 of an IC layout having vias with different via pad shapes 510. The via pad shapes 510 shown in FIG. 5 are merely examples and other shapes are available in other embodiments.

For a specific routing process, if a via is defined prior to selection of the start and target geometries to be routed, a via may be selected as the start or target geometry to be routed. A via may also be created after routing has begun to enable a pathway between the start and target geometries (in which case the via is referred to as a non-planar route segment rather than a start or target geometry). In either case, a connection between the via pad of the via and a route segment must be made where the connection configuration between the via pad and the route segment possibly contains an acute angle (as illustrated in FIG. 2B). In the case where a via is a start or target geometry, the via is treated as any other start or target geometry so that border regions and associated rules are defined for the via (as discussed in Section IV). In the case where the via is a route segment, pretabulated configuration tables are used to determine validity of the connection configuration between the via and the route segment (as discussed in Section IV).

In the description below, the term geometry or geometries refers to objects in the layout that are considered during routing. Such objects include, for example, circuit modules, pins of circuit modules, via pads, previously defined interconnect lines, etc. A geometry may comprise a start geometry (i.e., a geometry where a particular route begins), a target geometry (i.e., a geometry where a particular route ends), or an obstacle geometry (i.e., a geometry that must be routed around when routing between the start and target geometries). Any previously defined object in a layout may comprise a start or target geometry. For example, a start or target geometry of a route may be a pin of a circuit module, a previously defined interconnect line or via pad, etc., that is needed to be connected to another geometry on the same layer or another layer of the IC.

As used herein, a route is a connecting pathway from a particular start geometry to a particular target geometry and has one or more connected route segments. A route segment is a portion of a route that is straight and is along a particular routing direction. A potential route segment is a route segment that is considered for inclusion in the route between the start and target geometries but which has not yet been included in the route. Potential route segments are produced by path expansions and tested for inclusion in the route by methods of the present invention. In contrast, a defined route segment is a segment that has passed the testing processes of the present invention and is included in the route between the start and target geometries.

A route segment may be planar (does not traverse to another layer) or non-planar (traverses to another layer). A planar route segment is an interconnect line and a non-planar route segment is a via which are produced by path expansions during routing. Note that only when a via is previously defined that it may be selected as a start or target geometry, which is distinct from a via being created during routing of start and target geometries. When start and target geometries have been selected and a via is created during routing, the via is referred to as a non-planar route segment.

As used herein, a route contains an acute angle when either 1) a segment in the route connects with a start or target geometry at an angle of less than 90° or 2) a segment in the route connects with another segment in the route at an angle of less than 90°. When a segment connects with a geometry or another segment, a geometric configuration (referred to as a connection configuration) is formed by the segment and the geometry or other segment. In some embodiments, procedures are performed to test whether any acute angles are contained in these connection configurations.

II. Methods of Acute Angle Avoidance in Routing

A. Overview

After a router selects a start and target geometry for routing, the router performs a path search to identify a route between the start and target geometries. Typically, a path search identifies a path from a start geometry to a target geometry by iteratively identifying path expansions, where each expansion is from a start grid point to a destination grid point in a particular direction (as discussed above in relation to FIG. 3). Each path expansion defines a potential route segment in the route between the start and target geometries. A path search uses the methods of the present invention to determine validity of path expansions identified during the path search. In some embodiments, identified path expansions are tested for acute angles that are potentially created by the path expansions. After a path search reaches the target geometry from the start geometry, the process in some embodiments performs a back-trace operation that defines a route that traces the set of expansions that connect the start and target geometries.

To assist in avoiding acute angles in routing, some embodiments define at least one border region about a start geometry and a target geometry that have been selected for routing (as discussed below in Section III). Associated with each border region of a start or target geometry are one or more routing rules that specify valid routing configurations within the border region. Path expansions that produce a potential route segment that has a start or destination point falling within the border region of a start or target geometry are tested in accordance with the routing rules associated with the border region. For example, a routing rule may prohibit particular routing directions within the border region that cause acute angles at a connection point to the start or target geometry.

When the start and destination points of a potential route segment lie outside a border region of a start or target geometry, another testing process occurs. Specifically, after a path expansion is identified to produce a potential route segment, the connection configuration formed by the potential route segment and the just defined route segment (i.e., the route segment defined in the last path expansion iteration) are analyzed. In some embodiments, one or more pretabulated configuration tables are used to determine whether a connection configuration is valid (i.e., whether it contains no acute angles).

B. Path Search

Figure 6:
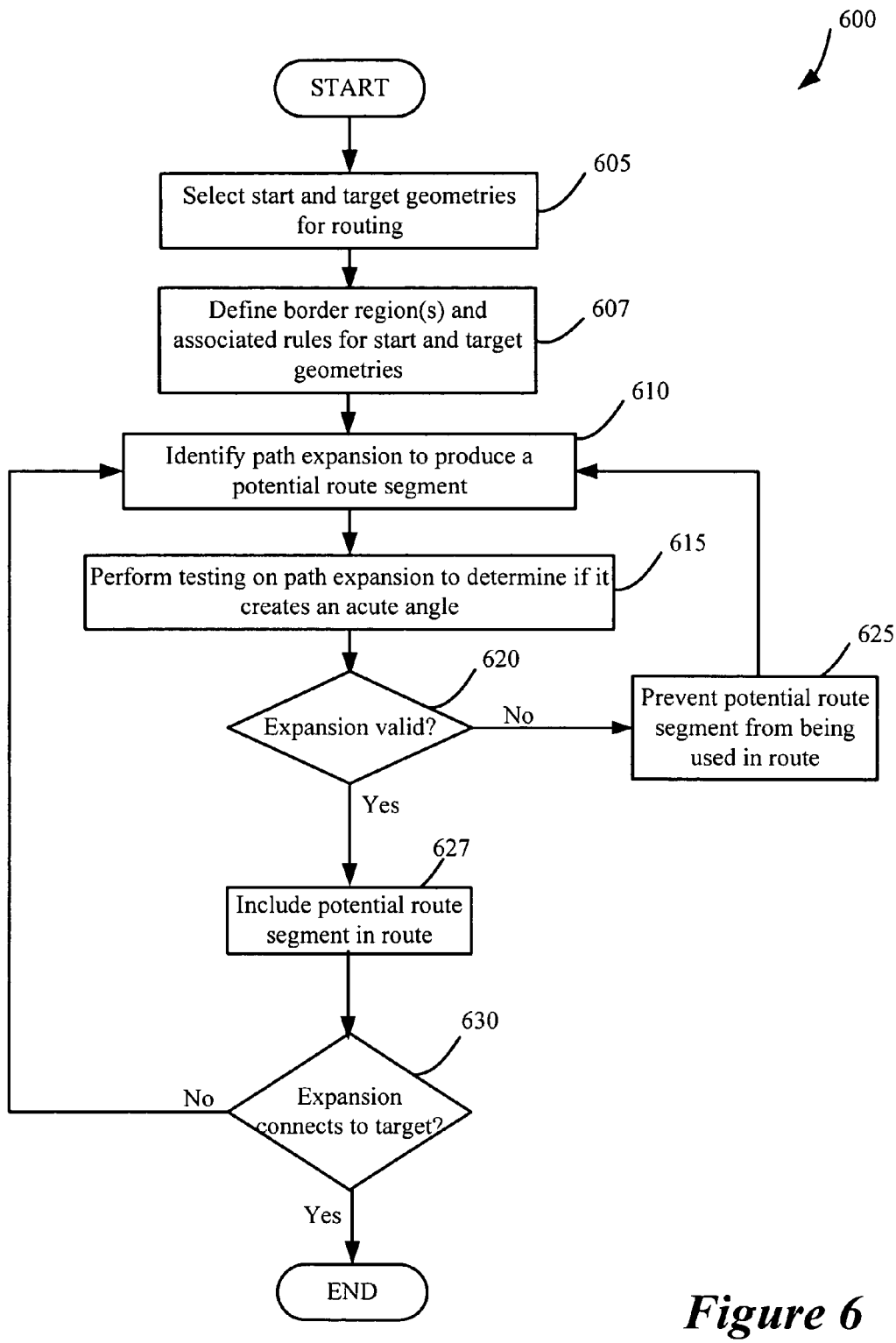
FIG. 6 is a flow chart of a general method of a router that uses the methods of the present invention.

FIG. 6 is a flow chart of a general method 600 of a router that uses the methods of the present invention. As shown in FIG. 6, the router initially selects (at 605) a start and target geometry to be routed. The start and target geometries may or may not be on the same layer. The method then defines (at 607) one or more border regions (and associated routing rules for the one or more border regions) for the start geometry and for the target geometry. Defining a border region and routing rules for the border region is discussed below in Section III.

A path search is then performed in steps 610–630 to determine a route (pathway) that connects the start and target geometries. In performing the path search, one or more potential route segments that may be included in the route are produced. During performance of the path search, the potential route segments are tested to determine whether they create acute angles in the route. The path search process may use one of many different path search techniques (such as line search, maze search, A*, etc.) to identify a set of expansions that connect the start and target geometries. In some embodiments, the router defines a routing grid for a region being routed. (FIG. 3 illustrates examples of five routing grids for the five wiring layers of FIG. 1.) In identifying the set of expansions that connect the start and target geometries, a path search process typically explores numerous path expansions. Exploring a path expansion (which starts at a start grid point and goes to a destination grid point) often entails (1) identifying the potential for the expansion, (2) determining the viability of the path expansion, and when the expansion is viable, (3) costing the expansion.

In some embodiments, the router explores four planar routing directions on a layer, which are the horizontal, vertical, and ±45° routing directions. These four routing directions yield eight segment directions, 0°, 45°, 90°, 135°, 180°, 225°, 270°, and 315°. In some embodiments, the router can explore non-planar routing directions (up or down) to define a multi-layer route that traverses multiple layers. A multi-layer route uses at least one non-planar route segment (i.e., via) to traverse from one layer to another.

To begin the path search, the router identifies (at 610) a path expansion to produce a potential route segment. Each potential route segment has an associated segment direction that is defined by one of ten possible expansion directions (0°, 45°, 90°, 135°, 180°, 225°, 270°, 315°, up, or down). The method then performs testing (at 615) on the potential route segment produced by the path expansion to determine if an acute angle is created by the potential route segment. The testing procedures determine whether the path expansion is valid (i.e., an acute angle is not created in the route by the path expansion) or invalid (i.e., an acute angle is created in the route by the path expansion). These testing procedures are discussed below in relation to FIG. 7.

The method then checks (at 620) whether the testing procedures have determined the path expansion to be valid. If not, the method prevents (at 625) the potential route segment produced by the path expansion to be included in the route between the start and target geometries. For example, the method may prohibit any later path expansions to start on (i.e., be based upon) the potential route segment. The method then proceeds at step 610 where a next path expansion is identified.

If the method determines (at 620—Yes) that the testing procedures have found the path expansion to be valid, the method includes (at 627) the potential route segment in the route between the start and target geometries, the potential route segment then being referred to as a defined route segment. The method then checks (at 630) whether the path expansion produces a route segment that connects to the target geometry. If so, the method ends. If not, the method proceeds at step 610 where a next path expansion is identified, the next path expansion being based upon (i.e., starts at) the just defined route segment.

Figure 7:
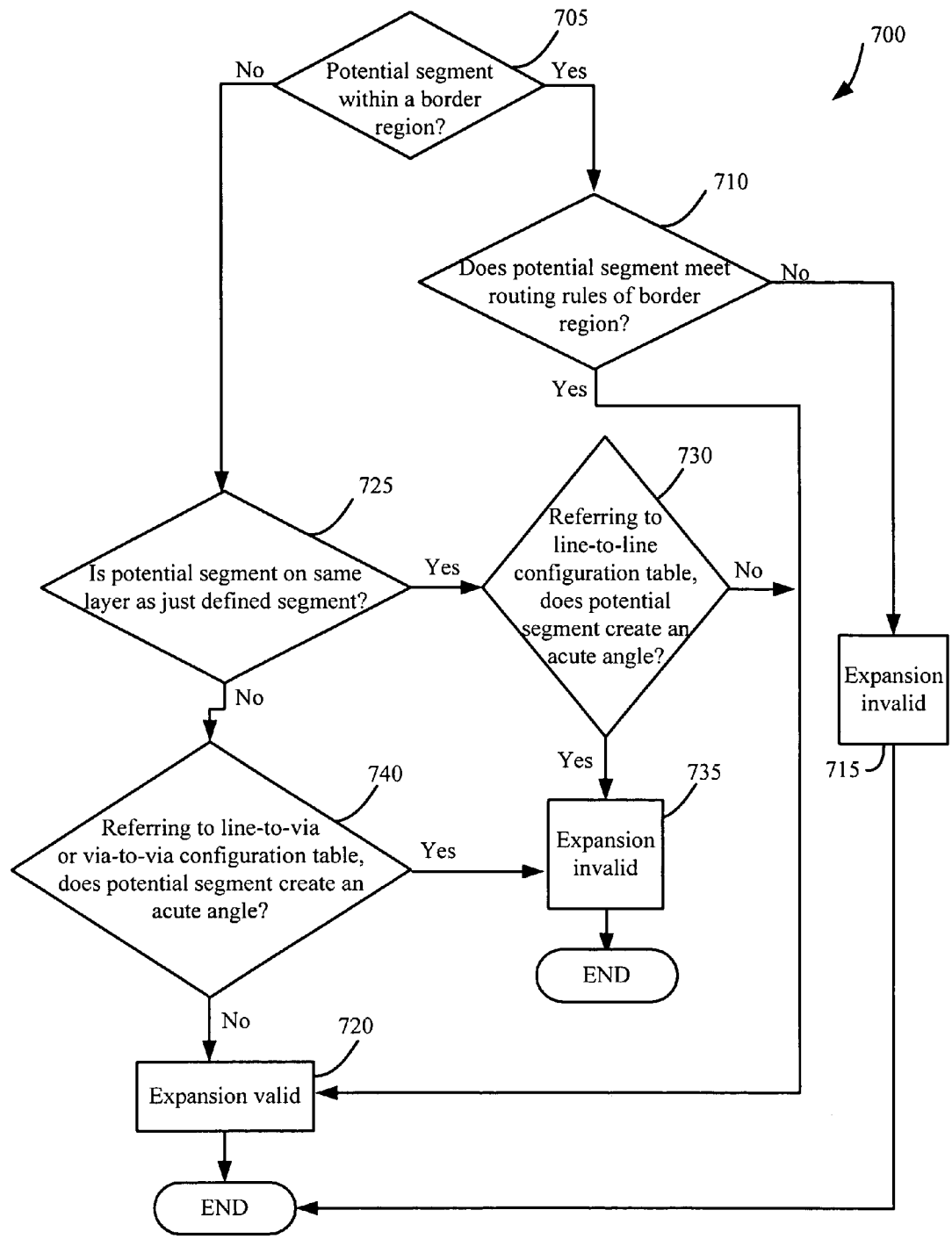
FIG. 7 is a flow chart of a testing process that the routing method of FIG. 6 uses to determine whether an identified path expansion creates an acute angle.

As mentioned above, the path search that the routing method 600 performs uses methods of the present invention to determine validity of path expansions that it identifies. FIG. 7 is a flow chart of a testing process 700 that the routing method 600 uses to determine whether an identified path expansion is valid (i.e., whether the identified path expansion does not create an acute angle). The testing process 700 begins after the router identifies (at 610) a path expansion to produce a potential route segment.

The process 700 then determines (at 705) if the potential route segment is within a border region of a start or target geometry (the border regions being defined at step 607 of FIG. 6). In some embodiments, a potential route segment is within a border region of a start or target geometry if the start point or destination point that define the potential route segment are within the border region of a start or target geometry. In other embodiments, a potential route segment is within a border region of a start or target geometry if the start and destination points that define the potential route segment are within the border region of a start or target geometry.

If the potential route segment is within a border region of a start or target geometry, the process 700 then determines (at 710) whether the potential route segment meets the routing rules associated with the border region within which the potential route segment is located (the associated routing rules being defined at step 607 of FIG. 6). Routing rules associated with border regions are defined in such a way as to avoid the creation of acute angles at connection points between route segments and start and target geometries.

If the potential route segment meets (at 710—Yes) the routing rules associated with the border region within which the potential route segment is located, the process then identifies (at 720) the path expansion that produced the potential route segment as valid and the process ends. If the potential route segment does not meet (at 710—No) the routing rules associated with the border region, the process identifies (at 715) the path expansion as invalid and the process ends.

If the process 700 determines that the potential route segment is not within a border region of a start or target geometry (at 705—No), the process then determines (at 725) whether the potential route segment is on the same layer as the just defined segment (i.e., the route segment defined in the last iteration of method 600). If the potential route segment and the just defined segment are on the same layer, the path expansion is creating a connection between two interconnect lines. If the potential route segment and the just defined segment are not on the same layer, the path expansion is creating a connection between an interconnect line and a via or a connection between two vias (referred to as "stacked" vias).

If the process determines (at 725) that the potential route segment is on the same layer as the just defined segment (and thus, both segments are interconnect lines to be connected on the same layer), the process determines (at 730) whether the potential route segment creates an acute angle when connecting to the just defined segment. This determination is made by referring to a line-to-line configuration table which contains various connection configurations between two interconnect lines and the validity of each configuration. Line-to-line configuration tables are discussed below in Section IV. If the process determines that the potential route segment creates an acute angle in the route, the process identifies (at 735) the path expansion that produced the potential route segment as invalid and the process ends. If the process determines that the potential route segment does not create an acute angle in the route, the process identifies (at 720) the expansion as valid and the process ends.

If the process determines (at 725—No) that the potential route segment is not on the same layer as the just defined segment (and thus, one of the segments is an interconnect line and one of the segments is a via or both of the segments are vias), the process determines (at 740) whether the potential route segment creates an acute angle when connecting to the just defined segment. If either the potential route segment or the just defined segment is an interconnect line, this determination is made by referring to a line-to-via configuration table which contains various connection configurations between an interconnect line and a via and the validity of each configuration. If both the potential route segment and the just defined segment are vias (and thus two layers are being traversed), this determination is made by referring to a via-to-via configuration table which contains various connection configurations between via pads of different shapes and the validity of each configuration. Line-to-via configuration tables and via-to-via configuration tables are discussed below in Section IV.

If the process determines (at 740—Yes) that the potential route segment creates an acute angle in the route, the process identifies (at 735) the path expansion producing the potential route segment as invalid and the process ends. If the process determines that the potential route segment does not create an acute angle in the route, the process identifies (at 720) the expansion as valid and the process ends.

III. Route Connection to Start and Target Geometries

To assist in avoiding acute angles in routing, some embodiments define at least one border region about a start geometry and a target geometry that have been selected for routing. Associated with each border region of a start or target geometry are one or more routing rules that specify valid routing configurations at connection points to the start or target geometry within the border region.

Each start or target geometry has three or more sides, each side comprising a border that defines the geometry. Similar to a route segment, a side of a geometry may have a horizontal, vertical, or diagonal (+45°, or −45°) orientation. In some embodiments, however, a side of a geometry may have only horizontal or vertical orientations (e.g., for layers having Manhattan preferred wiring), or may have only diagonal orientations (e.g., for layers having diagonal preferred wiring). As stated above, a route contains an acute angle when a segment in the route connects with a start or target geometry at an angle of less than 90°. Specifically, a segment in the route connects with a start or target geometry at an acute angle when it forms an acute angle with a side of the start or target geometry to which it connects (as illustrated in FIGS. 2A and 2B).

Figure 8A:
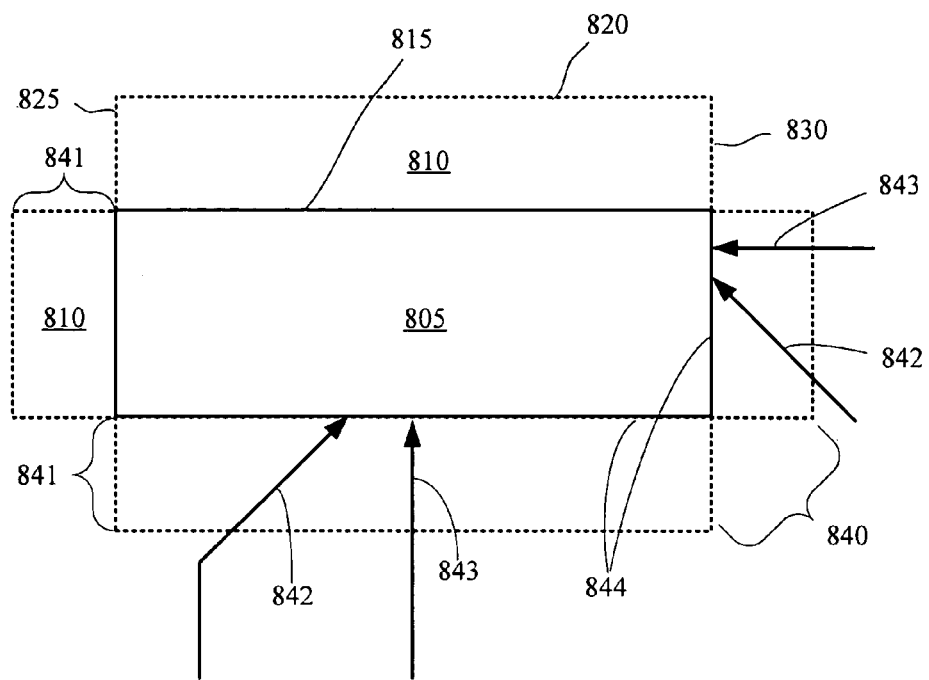
FIGS. 8A and 8B illustrates examples of defining a border region about a geometry.
Figure 8B:
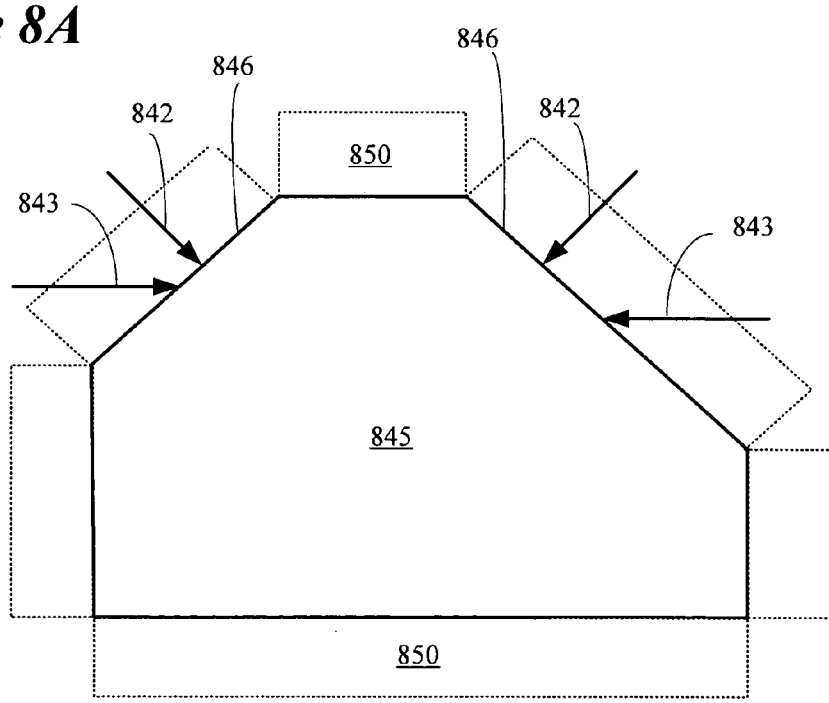

FIGS. 8A and 8B illustrates examples of defining a border region about a start or target geometry. The start or target geometry may be a pin, previously defined interconnect line, via pad, etc. FIG. 8A shows a four-sided start or target geometry 805. A border region 810 is defined for each side of the geometry 805 where each border region 810 neighbors a side of the geometry 805. FIG. 8B shows a six-sided start or target geometry 845. A rectangular border region 850 is defined for each side of the geometry 845 where each border region 850 neighbors a side of the geometry 845. In other embodiments, one or more border regions are defined about a start and target geometry.

In some embodiments, a border region of a geometry is a rectangular region adjacent to a side of the geometry. In some embodiments, a border region of a geometry is defined by a first line 815 that is equivalent to a particular side of the geometry, a second line 820 that is parallel to the first line 815, a third line 820 that is perpendicular to the first line 815, and a fourth line 820 that is also perpendicular to the first line 815. The thickness 841 of a border region (i.e., the distance between the first line 815 and the second line 820) may vary for each border region or may be equal for each border region of a geometry. In some embodiments, the thickness 841 of a border region is equal to the minimum length of a route segment as specified by a design rule. Corner regions 840 about the corners of the geometry 805 may or may not be included in the border regions. Corner regions 840 are not necessarily included in border regions since route segments connecting to the geometry 805 at the corners of the geometry 805 do not form acute angles with any side of the geometry 805. In some embodiments, however, corner regions 840 are included in border regions to account for differences in the widths of interconnect lines (discussed below in Section IV).

Associated with each border region of a start or target geometry are one or more routing rules that specify valid routing configurations (i.e., configurations that do not contain acute angles) at connection points to the start or target geometry within the border region. Path expansions that produce a potential route segment that has a start or destination point falling within the border region of a start or target geometry are tested in accordance with the routing rules associated with the border region. If a path expansion meets the routing rules associated with the border region, the path expansion is identified as a valid expansion, otherwise it is not (as discussed in Section II).

In some embodiments, a routing rule of a border region is defined according to the orientation of a side of a geometry that the border region neighbors. In some embodiments, if the side of a geometry that the border region neighbors has a vertical or horizontal orientation, a routing rule for the border region specifies that route segments within the border region can not have a diagonal orientation (i.e., route segments within the border region can only have a vertical or horizontal orientation). In some embodiments, if the side of a geometry that the border region neighbors has a diagonal orientation, a routing rule for the border region specifies that route segments within the border region can not have a vertical or horizontal orientation (i.e., route segments within the border region can only have a diagonal orientation). Routing rules defined in this manner specify valid routing configurations within the border regions and help prevent acute angles from being formed at connection points to start or target geometries.

As shown in FIG. 8A, a potential route segment 842 having a diagonal orientation connects to a side 844 of a geometry 805 having a horizontal or vertical orientation at an acute angle. On the other hand, a potential route segment 843 having a horizontal or vertical orientation does not connect to a side 844 of a geometry 805 having a horizontal or vertical orientation at an acute angle. As such, a routing rule for a border region adjacent to a vertical or horizontal side of a geometry requiring that route segments within the border region not have a diagonal orientation (i.e., have only a vertical or horizontal orientation) avoids acute angles from being formed within the border region.

As shown in FIG. 8B, a potential route segment 843 having a horizontal or vertical orientation connects to a side 846 of a geometry 845 having a diagonal orientation at an acute angle. On the other hand, a potential route segment 842 having a diagonal orientation does not connect to a side 846 of a geometry 805 having a diagonal orientation at an acute angle. As such, a routing rule for a border region adjacent to a diagonal side of a geometry requiring that route segments within the border region not have a vertical or horizontal orientation (i.e., have only a diagonal orientation) avoids acute angles from being formed within the border region.

In some embodiments, a routing rule associated with a border region specifies that all route segments in the border region have the same routing direction, e.g., horizontal. As stated above, in some embodiments, the thickness 841 of a border region is equal to the minimum length of a route segment as specified by a design rule. By also defining a routing rule that requires all route segments in the border region to have the same routing direction, it is ensured that a route segment in the border region meets the minimum length specified by the design rule.

IV. Route Pathway from Start Geometry to Target Geometry

When the start and destination points of a potential route segment lie outside a border region of a start or target geometry, another set of tests occur. Specifically, after a path expansion produces a potential route segment, the connection configuration formed by the potential route segment and the just defined route segment (i.e., the route segment defined in the last iteration) are analyzed. In some embodiments, one or more pretabulated tables are used to determine whether a connection configuration is valid (i.e., whether it contains no acute angles).

A. Line-to-Line Configuration Table

Recall that in the testing process 700 of FIG. 7, the process determines (at 725) whether a potential route segment is on the same layer as a just defined segment. This step determines whether the path expansion is creating a connection between two interconnect lines. If the potential route segment and the just defined segment are on the same layer, both route segments are interconnect lines that are to be connected. In this case, the process 700 uses a pretabulated line-to-line configuration table to determine whether the potential route segment creates an acute angle when connecting to the just defined segment. The line-to-line configuration table contains various configurations of line-to-line connections and the validity of each configuration.

Figure 9:
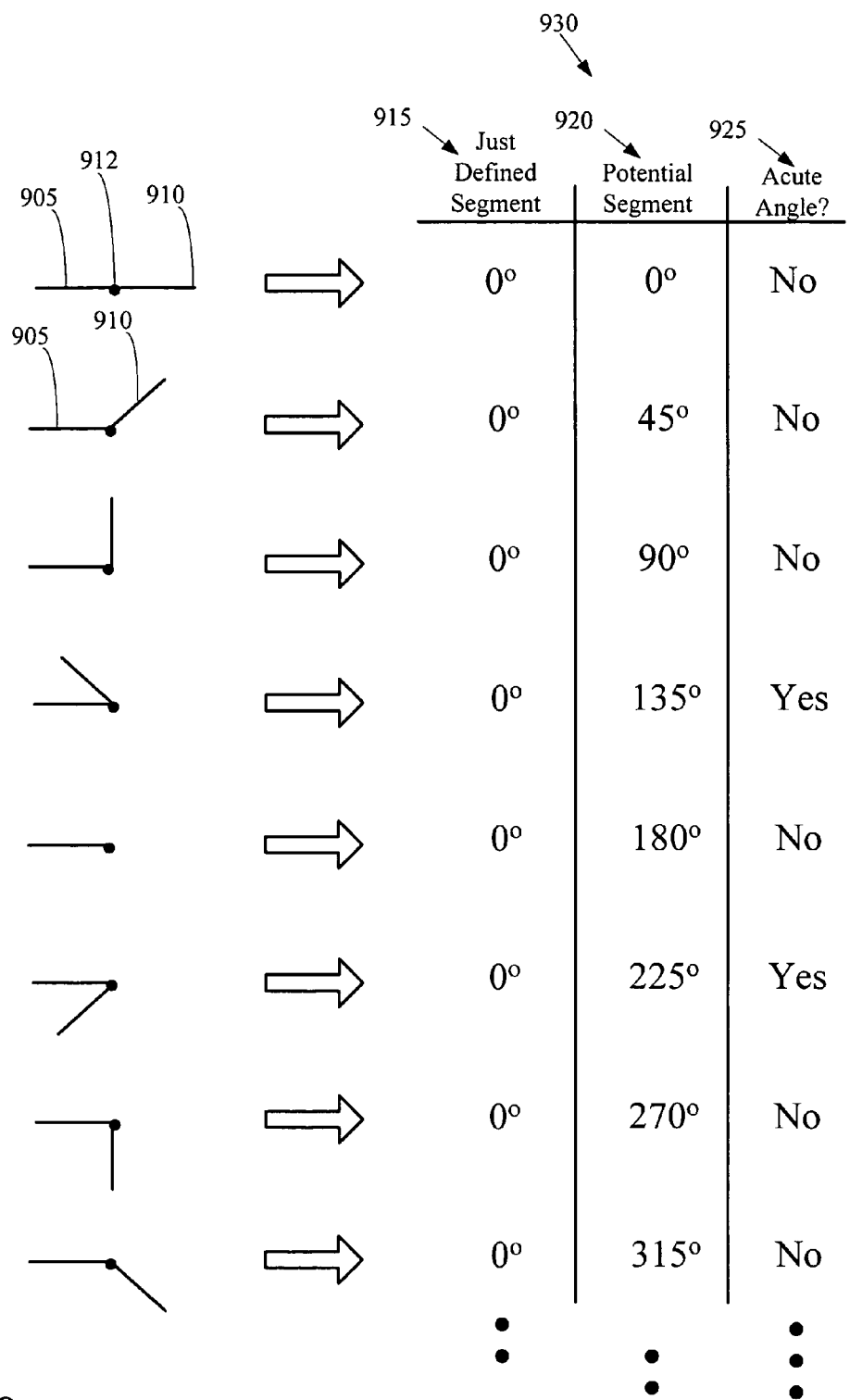
FIG. 9 is a conceptual diagram of how a line-to-line configuration table is created in some embodiments.

FIG. 9 is a conceptual diagram of how a line-to-line configuration table is created in some embodiments. As shown in FIG. 9, a just defined route segment 905 having a particular segment direction is shown graphically next to a potential route segment 910 also having a particular segment direction, the two segments being connected at a connection point 912. Each permutation of connection configurations between the two segments are shown for the case where the just defined route segment 905 has a segment direction of 0°. This produces eight permutations where the potential route segment 910 has segment directions of 0°, 45°, 90°, 135°, 180°, 225°, 270°, and 315°.

Although not shown in FIG. 9, in some embodiments, every connection configuration possible between the two segments is explored. For example, connection configurations where the just defined route segment 905 has a segment direction of 45°, 90°, 135°, 180°, 225°, 270°, and 315° would also be explored along with each possible segment direction of the just defined route segment 905. As such, 64 possible permutations of connection configurations that are possible between the two segments would be defined (since eight possible segment directions for each segment produces 64 variations).

A line-to-line configuration table 930 can be created containing the segment direction 915 of the just defined route segment 905 and the segment direction 920 of the potential route segment 910 for each possible connection configuration between the two segments (although the example shown in FIG. 9 shows only those connection configurations where the just defined route segment 905 has a segment direction of 0°). For each possible connection configuration, the table 930 also contains an acute angle entry 925 that indicates whether the connection configuration contains an acute angle. In the example shown in FIG. 9, an acute angle entry 925 is either "Yes" or "No." In other embodiments, other entries are used to indicate the formation of an acute angle, such as a "1" for a connection configuration that creates an acute angle and a "0" for a connection configuration that does not create an acute angle.

The line-to-line configuration table is then referred to by the testing process 700 (of FIG. 7) for evaluation of particular connection configurations between a potential route segment and a just defined route segment. Using the line-to-line configuration table, if the testing process 700 determines that the potential route segment creates an acute angle with the just defined route segment, the process identifies (at 735) the expansion producing the potential route segment as invalid. Otherwise, the process determines that the potential route segment does not create an acute angle with the just defined route segment and identifies (at 720) the expansion as valid.

B. Line-to-Via Configuration Table

Recall that if the testing process 700 determines (at 725) that the potential route segment and the just defined segment are not on the same layer, an interconnect line and a via (specifically the via pad) or two vias are to be connected. If either the potential route segment or the just defined segment is an interconnect line, the testing process 700 then uses a pretabulated line-to-via configuration table to determine whether any acute angles are created in the connection configuration between the interconnect line and the via (specifically the via pad). A line-to-via configuration table contains various connection configurations between a via pad and an interconnect line and the validity of each. In some embodiments, pretabulated line-to-via configuration tables are created for each distinct via pad shape available for use on different layers of an IC.

Figure 10:
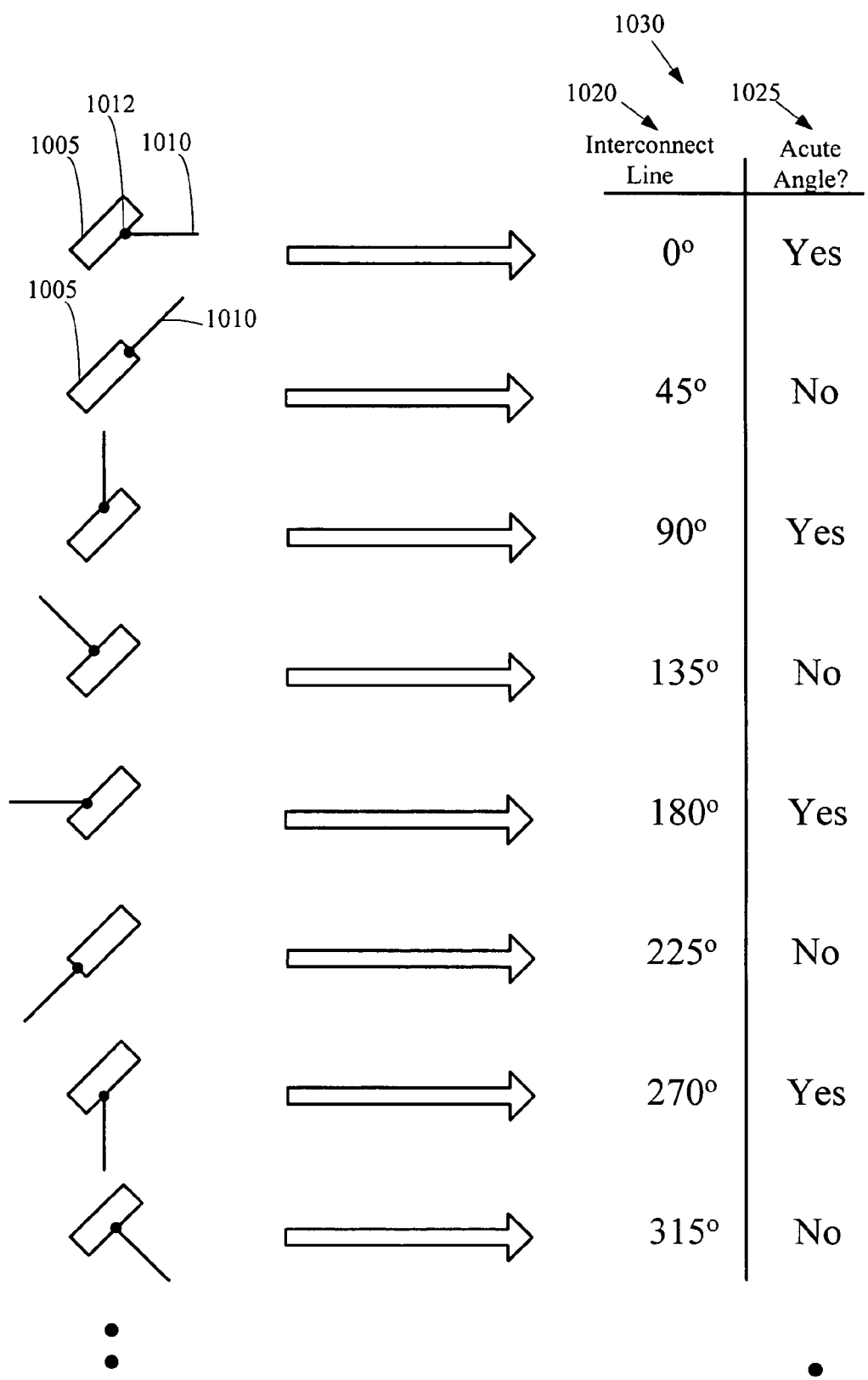
FIG. 10 shows a conceptual diagram of how a line-to-via configuration table is created in some embodiments.

FIG. 10 shows a conceptual diagram of how a line-to-via configuration table is created in some embodiments. As shown in FIG. 10, a via 1005 having a particular via pad shape is shown graphically next to an interconnect line 1010 having a particular segment direction, the via 1005 and the interconnect line 1010 being connected at a connection point 1012. Each permutation of connection configurations between the via 1005 and the interconnect line 1010 are shown for the case where the via 1005 has a particular via pad shape. This produces eight permutations where the interconnect line 1010 has segment directions of 0°, 45°, 90°, 135°, 180°, 225°, 270°, and 315°.

Although not shown in FIG. 10, in some embodiments, every connection configuration possible between an interconnect line and other via pad shapes possible on any layer of the IC being routed is also explored. FIG. 5 illustrates other examples of possible via pad shapes. In some embodiments, other distinct via pad shapes are produced by rotating a given via pad shape by a particular angle, for example, by multiples of 45° to produce different via pad shapes. For each distinct via pad shape, there are eight connection configurations possible between the via pad shape and an interconnect line (as shown in FIG. 10).

Figure 11:
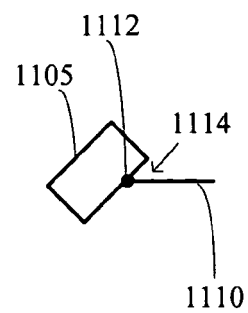
FIG. 11 shows diagrams of a via connected to interconnect lines of different widths.
Figure 11:
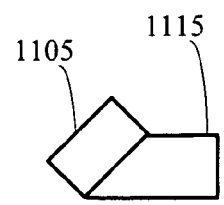

Although not shown in FIG. 10, in some embodiments, every connection configuration possible between a given via pad shape and other interconnect line types possible on any layer of the IC being routed is also explored. Interconnect lines can vary in terms of width, wire end style, etc. For example, depending on the width of an interconnect line, an acute angle may or may not be formed at the connection point to a via pad shape. FIG. 11 shows diagrams of a via connected to interconnect lines of different widths. In the top diagram, a via 1105 having a particular via pad shape is shown graphically next to an interconnect line 1110 having a particular segment direction and a particular width, the via 1105 and the interconnect line 1110 being connected at a connection point 1112 where an acute angle 1114 is formed. In the bottom diagram, the same via 1105 is shown connected to an interconnect line 1115 having the same segment direction as the interconnect line 1110 in the top diagram but having a larger width. The via 1105 and the interconnect line 1115, however, do not form an acute angle at their connection point.

A line-to-via configuration table 1030 can be created containing the segment direction 1020 of the interconnect line 1010 for each possible connection configuration between the interconnect line 1010 and the via 1005. For each possible connection configuration, the table 1030 also contains an acute angle entry 1025 that indicates whether the connection configuration contains an acute angle. In the example shown in FIG. 10, an acute angle entry 1025 is either "Yes" or "No." In other embodiments, other entries are used to indicate the formation of an acute angle, such as a "1" for a connection configuration that creates an acute angle and a "0" for a connection configuration that does not create an acute angle.

The line-to-via configuration table is then referred to by the testing process 700 (of FIG. 7) for evaluation of particular connection configurations between a potential route segment and a just defined route segment. Using the line-to-via configuration table, if the testing process 700 determines that the potential route segment creates an acute angle with the just defined route segment, the process identifies (at 735) the expansion producing the potential route segment as invalid. Otherwise, the process determines that the potential route segment does not create an acute angle with the just defined route segment and identifies (at 720) the expansion as valid.

C. Via-to-Via Configuration Table

Recall that if the testing process 700 determines (at 725) that the potential route segment and the just defined segment are not on the same layer, an interconnect line and a via (specifically the via pad) or two vias are to be connected. If both the potential route segment and the just defined segment are vias (and thus two layers are being traversed), the testing process 700 then uses a pretabulated via-to-via configuration table to determine whether any acute angles are created in the connection configuration between the two stacked vias (specifically the via pad). A via-to-via configuration table contains various connection configurations between via pads of different shapes and the validity of each configuration. In some embodiments, pretabulated via-to-via configuration tables are created for each distinct via pad shape available for use on different layers of an IC.

Figure 12:
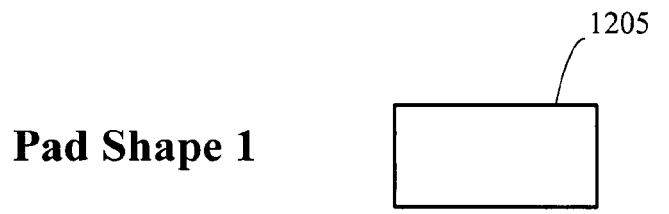
FIG. 12 shows an example of four different via pad shapes.
Figure 12:
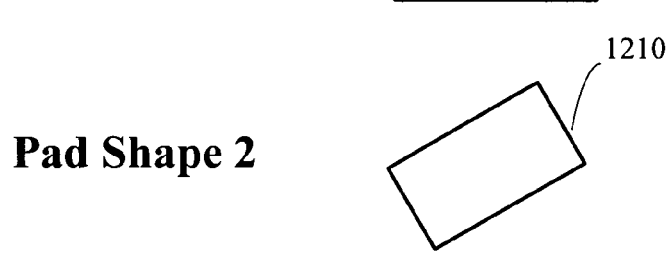
Figure 12:
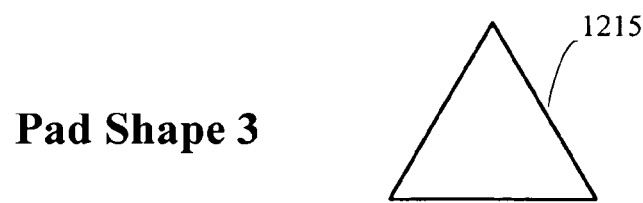
Figure 12:
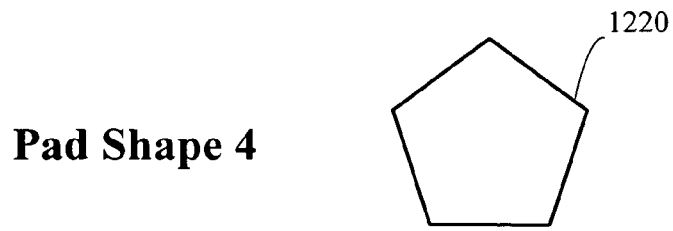
Figure 13:
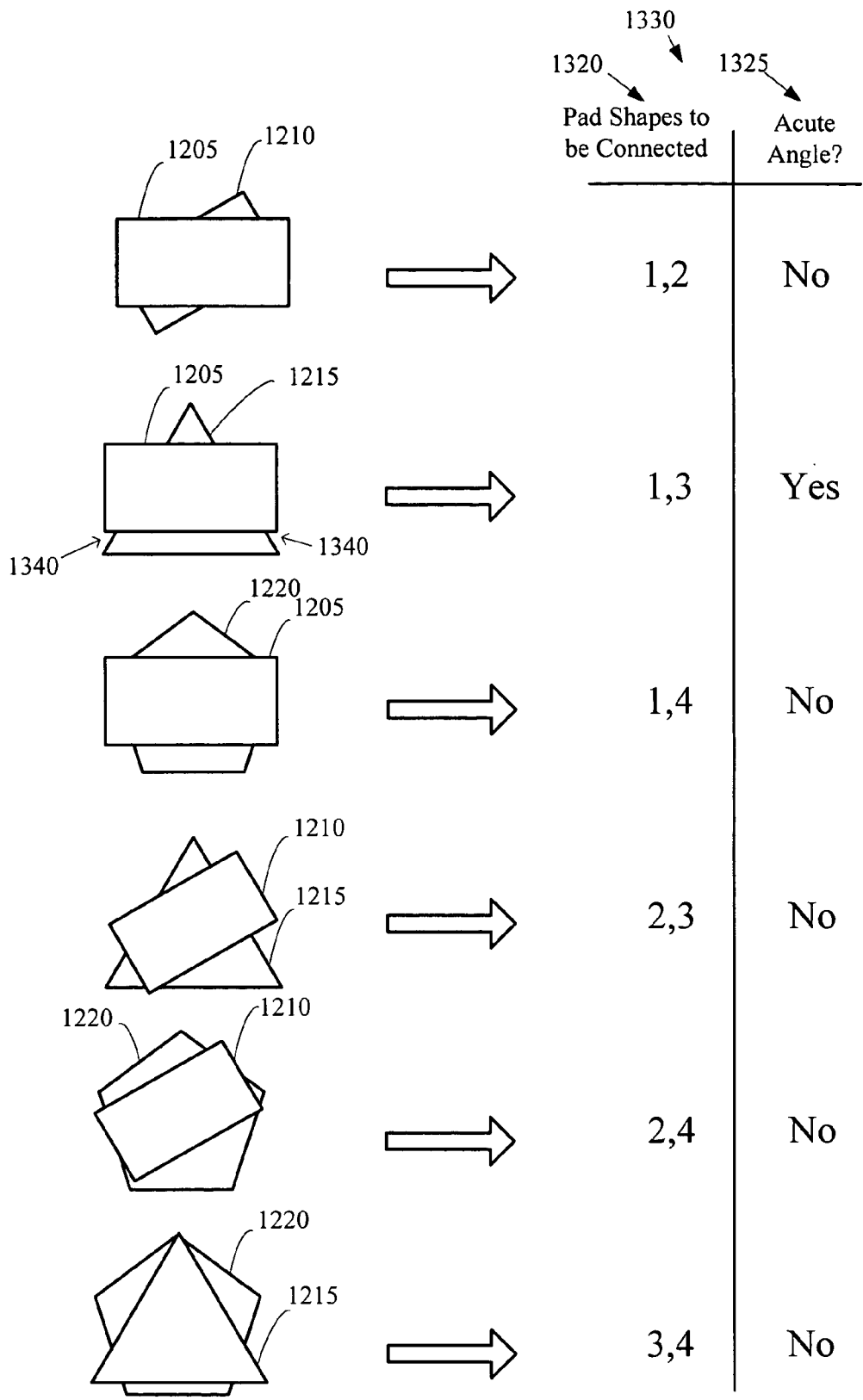
FIG. 13 shows a conceptual diagram of how a via-to-via configuration table is created in some embodiments.

FIG. 12 shows an example of four different via pad shapes, each pad shape having an associated number: via pad shape 1 1205, via pad shape 2 1210, via pad shape 3 1215, and via pad shape 4 1220. FIG. 13 shows a conceptual diagram of how a via-to-via configuration table is created in some embodiments. As shown in FIG. 13, four distinct via pads shapes 1205, 1210, 1215, and 1220 are connected (merged) on top of each other two at a time. Each merging of two distinct via pads shapes produces a merged geometric form that may or may not contain acute angles 1340. Each permutation of connection configurations between the different via pad shapes are explored. This produces six permutations for four distinct via pads shapes. In some embodiments, other distinct via pad shapes are produced by rotating a given via pad shape by a particular angle, for example, by multiples of 45° to produce different via pad shapes. Each permutation of connection configurations between the resulting via pad shapes are then explored as well.

A via-to-via configuration table 1330 can be created containing number pairs indicating connection configurations of particular via pad shapes to be connected, each number in the pair being associated with a particular via pad shape. For example, an entry of "1,3" in the table 1330 indicates a connection configuration between via pad shape 1 1205 and via pad shape 3 1215. For each possible connection configuration, the table 1330 also contains an acute angle entry 1325 that indicates whether the connection configuration (i.e., merged geometric form) contains an acute angle. In the example shown in FIG. 13, an acute angle entry 1325 is either "Yes" or "No." In other embodiments, other entries are used to indicate the formation of an acute angle, such as a "1" for a connection configuration that creates an acute angle and a "0" for a connection configuration that does not create an acute angle.

The via-to-via configuration table is then referred to by the testing process 700 (of FIG. 7) for evaluation of particular connection configurations between a potential route segment and a just defined route segment. Using the via-to-via configuration table, if the testing process 700 determines that the potential route segment creates an acute angle with the just defined route segment, the process identifies (at 735) the expansion producing the potential route segment as invalid. Otherwise, the process determines that the potential route segment does not create an acute angle with the just defined route segment and identifies (at 720) the expansion as valid.

Figure 14:
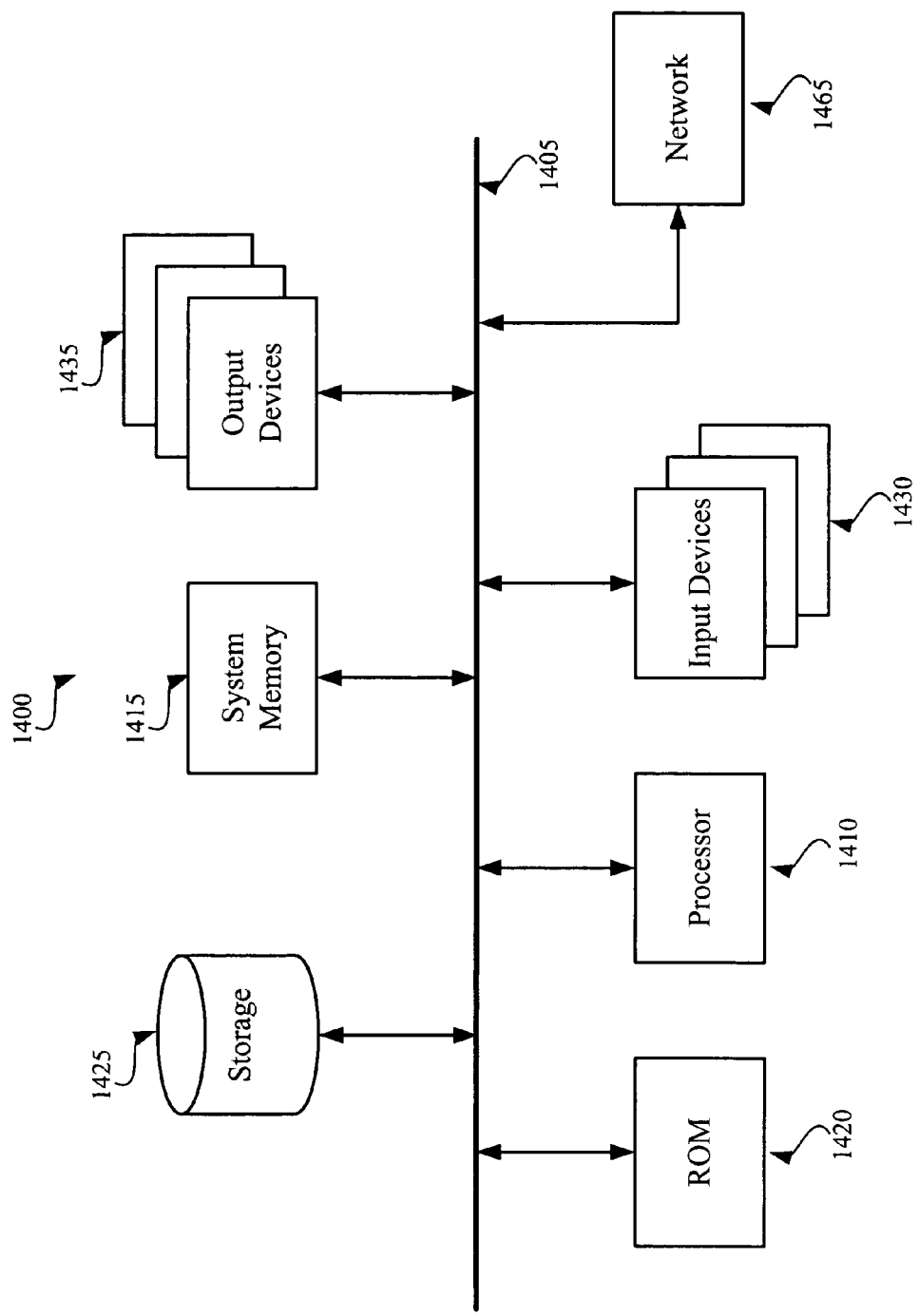
FIG. 14 conceptually illustrates a computer system with which one embodiment of the invention is implemented.

FIG. 14 conceptually illustrates a computer system with which one embodiment of the invention is implemented. Computer system 1400 includes a bus 1405, a processor 1410, a system memory 1415, a read-only memory 1420, a permanent storage device 1425, input devices 1430, and output devices 1435.

The bus 1405 collectively represents all system, peripheral, and chipset buses that support communication among internal devices of the computer system 1400. For instance, the bus 1405 communicatively connects the processor 1410 with the read-only memory 1420, the system memory 1415, and the permanent storage device 1425.

From these various memory units, the processor 1410 retrieves instructions to execute and data to process in order to execute the processes of the invention. The read-only-memory (ROM) 1420 stores static data and instructions that are needed by the processor 1410 and other modules of the computer system. The permanent storage device 1425, on the other hand, is a read-and-write memory device. This device is a non-volatile memory unit that stores instruction and data even when the computer system 1400 is off. Some embodiments of the invention use a mass-storage device (such as a magnetic or optical disk and its corresponding disk drive) as the permanent storage device 1425. Other embodiments use a removable storage device (such as a floppy disk or zip® disk, and its corresponding disk drive) as the permanent storage device.

Like the permanent storage device 1425, the system memory 1415 is a read-and-write memory device. However, unlike storage device 1425, the system memory is a volatile read-and-write memory, such as a random access memory. The system memory stores some of the instructions and data that the processor needs at runtime. In some embodiments, the invention's processes are stored in the system memory 1415, the permanent storage device 1425, and/or the read-only memory 1420.

The bus 1405 also connects to the input and output devices 1430 and 1435. The input devices enable the user to communicate information and select commands to the computer system. The input devices 1430 include alphanumeric keyboards and cursor-controllers. The output devices 1435 display images generated by the computer system. For instance, these devices display IC design layouts. The output devices include printers and display devices, such as cathode ray tubes (CRT) or liquid crystal displays (LCD).

Finally, as shown in FIG. 14, bus 1405 also couples computer 1400 to a network 1465 through a network adapter (not shown). In this manner, the computer can be a part of a network of computers (such as a local area network ("LAN"), a wide area network ("WAN"), or an Intranet) or a network of networks (such as the Internet). Any or all of the components of computer system 1400 may be used in conjunction with the invention. However, one of ordinary skill in the art will appreciate that any other system configuration may also be used in conjunction with the invention.

While the invention has been described with reference to numerous specific details, one of ordinary skill in the art will recognize that the invention can be embodied in other specific forms without departing from the spirit of the invention. For instance, although several embodiments of the invention were described for a detailed router, one of ordinary skill will realize that these embodiments can also be implemented for global routers. Thus, one of ordinary skill in the art would understand that the invention is not to be limited by the foregoing illustrative details, but rather is to be defined by the appended claims.

I claim:

1. A method of defining a route that connects a start geometry and a target geometry, the route being comprised of one or more connected route segments, the method comprising:
   a) performing a path search to produce a set of connected route-segment expansions between said start and target geometries;
   b) during the path search,
      i) identifying, from a first route-segment expansion, a second route-segment expansion and a third route-segment expansion;
      ii) discarding the second route-segment expansion because connecting the first route-segment expansion and second route-segment expansion would create an acute angle in the route;
      iii) maintaining the third route-segment expansion because connecting the first route-segment expansion and the third route-segment expansion would not create an acute angle in the route.

2. The method of claim 1 wherein an acute angle is created in the route when a two route segment expansions connect at an angle of less than 90°.

3. The method of claim 2 further comprising:
   before step a), defining at least one border region about the start or target geometry;
   defining at least one routing rule associated with the border region;
   determining whether a route-segment expansion is within the border region; and
   upon determining that the route-segment expansion is within the border region, testing the route-segment expansion to determine if the route-segment expansion meets the associated routing rule.

4. The method of claim 3 wherein the routing rule prohibits particular routing directions within the border region that would result in an acute angle being formed at a connection point between a route-segment expansion in the route and a start or target geometry.

5. The method of claim 3 wherein:
   the border region neighbors a side of the start or target geometry having a vertical or horizontal orientation; and the routing rule prohibits diagonal routing directions within the border region.

6. The method of claim 3 wherein:
the border region neighbors a side of the start or target geometry having a diagonal orientation; and
the routing rule prohibits vertical or horizontal routing directions within the border region.

7. The method of claim 3 wherein the border region is defined to have a thickness that is equal to a minimum length of a route segment specified by a predetermined design rule.

8. The method of claim 7 wherein the routing rule associated with the border region specifies that all route segments in the border region have the same routing direction.

9. A method of defining a route that connects a start geometry and a target geometry, the route being comprised of one or more connected route segments, the method comprising:
a) during said routing:
i) producing a set of route-segment expansions comprising at least two route-segment expansions;
ii) testing a route-segment expansion to determine whether it would create an acute angle in the route;
iii) preventing the tested route-segment expansion from being included in the route between the start and target geometries if the tested route-segment expansion would produce an acute angle in the route;
iv) including the tested route-segment expansion in the route between the start and target geometries if the tested route-segment expansion would not produce an acute angle in the route; and
v) iteratively repeating steps i), ii), iii), and iv).

10. The method of claim 9 wherein:
an acute angle is created in the route when a route-segment expansion connects with another route-segment expansion at an angle of less than 90°.

11. The method of claim 10 wherein testing comprises:
referring to a pretabulated configuration table to determine whether the route-segment expansion creates an acute angle in the route.

12. The method of claim 11 wherein the configuration table is a line-to-line configuration table that contains various connection configurations between two interconnect lines and an entry for each connection configuration indicating whether the connection configuration contains an acute angle.

13. The method of claim 12 wherein the line-to-line configuration table contains connection configurations where at least one of the two interconnect lines has directions of 0°, 45°, 90°, 135°, 180°, 225°, 270°, and 315°.

14. The method of claim 11 wherein the configuration table is a line-to-via configuration table that contains various connection configurations between an interconnect line and a via pad of a via and an entry for each connection configuration indicating whether the connection configuration contains an acute angle.

15. The method of claim 14 wherein the line-to-via configuration table contains connection configurations where the interconnect line has directions of 0°, 45°, 90°, 135°, 180°, 225°, 270°, and 315°.

16. The method of claim 14 wherein the line-to-via configuration table contains connection configurations of via pads having different shapes.

17. The method of claim 11 wherein the configuration table is a via-to-via configuration table that contains various connection configurations between a first via pad of a first via and a second via pad of a second via and an entry for each connection configuration indicating whether the connection configuration contains an acute angle.

18. The method of claim 17 wherein the via-to-via configuration table contains connection configurations of via pads having different shapes.

19. A computer readable medium that stores a computer program for routing a route that connects a start geometry and a target geometry, the route being comprised of one or more connected route segments, the computer program comprising sets of instructions for:
a) performing a path search to produce a set of route-segment expansions between said start and target geometries;
b) during the path search,
i) identifying, from a first route-segment expansion, a second route-segment expansion and a third route-segment expansion
ii) discarding the second route-segment expansion because the combination of the first route-segment expansion and second route-segment expansion would create an acute angle in the route;
iii) maintaining the third route-segment expansion because the combination of the first route-segment expansion and the third route-segment expansion would not create an acute angle in the route.

20. The computer readable medium of claim 19 wherein an acute angle is created in the route when a two route-segment expansions connect at an angle of less than 90°.

21. The computer readable medium of claim 20 wherein:
the computer program further comprises sets of instructions for:
defining at least one border region about the start or target geometry; and
defining at least one routing rule associated with the border region; and
determining whether a route-segment expansion is within the border region; and
upon determining that the route-segment expansion is within the border region, testing the route-segment expansion to determine if the route-segment expansion meets the associated routing rule.

22. The computer readable medium of claim 21 wherein the routing rule prohibits particular routing directions within the border region that would result in an acute angle being formed at a connection point between a route-segment expansion in the route and a start or target geometry.

23. The computer readable medium of claim 21 wherein:
the border region neighbors a side of the start or target geometry having a vertical or horizontal orientation; and
the routing rule prohibits diagonal routing directions within the border region.

24. The computer readable medium of claim 21 wherein:
the border region neighbors a side of the start or target geometry having a diagonal orientation; and
the routing rule prohibits vertical or horizontal routing directions within the border region.

25. A computer readable medium that stores a computer program for routing a route that connects a start geometry and a target geometry, the route being comprised of one or more connected route segments, the computer program comprising sets of instructions for:
a) during said routing:
i) producing a set of route-segment expansions comprising at least two route-segment expansions;
ii) testing a route-segment expansion to determine whether it would create an acute angle in the route;

iii) preventing the tested route-segment expansion from being included in the route between the start and target geometries if the tested route-segment expansion would produce an acute angle in the route;

iv) including the tested route-segment expansion in the route between the start and target geometries if the tested route-segment expansion would not produce an acute angle in the route; and v) iteratively repeating the sets of instructions for i), ii), iii), and iv).

26. The computer readable medium of claim 25 wherein:
a route-segment expansion comprises an interconnect line or a via; and
an acute angle is created in the route when a route-segment expansion connects with another route-segment expansion at an angle of less than 90°.

27. The computer readable medium of claim 26 wherein the set of instructions for testing the route-segment expansion comprises a set of instructions for referring to a pretabulated configuration table to determine whether the route-segment expansion would create an acute angle in the route.

28. The computer readable medium of claim 27 wherein the configuration table is a line-to-line configuration table that contains various connection configurations between two interconnect lines and an entry for each connection configuration indicating whether the connection configuration contains an acute angle.

29. The computer readable medium of claim 27 wherein the configuration table is a line-to-via configuration table that contains various connection configurations between an interconnect line and a via pad of a via and an entry for each connection configuration indicating whether the connection configuration contains an acute angle.

30. The computer readable medium of claim 27 wherein the configuration table is a via-to-via configuration table that contains various connection configurations between a first via pad of a first via and a second via pad of a second via and an entry for each connection configuration indicating whether the connection configuration contains an acute angle.

31. A method of generating a route, said method comprising:
a) identifying a plurality of potential path expansions wherein each potential path expansion except a first potential path expansion comes from an immediately preceding potential path expansion and each potential path expansion has a direction;
b) wherein identifying a potential path expansion comprises:
i) comparing the direction of a potential path expansion with the direction of the immediately preceding potential path expansion;
ii) determining whether the direction of the potential path expansion forms an acute angle with the direction of the immediately preceding potential path expansion; and
iii) discarding the potential path expansion if it would form an acute angle with said immediately preceding path expansion.

* * * * *